(12) United States Patent
Fujisaku et al.

(10) Patent No.: US 12,155,394 B2
(45) Date of Patent: Nov. 26, 2024

(54) ATOMIC OSCILLATOR (71) Applicant: NEC Corporation, Tokyo (JP)

(72) Inventors: Takahiro Fujisaku, Tokyo (JP); Kenta Matsumoto, Tokyo (JP); Sota Kagami, Tokyo (JP)

(73) Assignee: NEC CORPORATION, Tokyo (JP)

( * ) Notice: Subject to any disclaimer, the term of this patent is extended or adjusted under 35 U.S.C. 154(b) by 97 days.

(21) Appl. No.: 18/113,215

(22) Filed: Feb. 23, 2023

(65) Prior Publication Data
US 2023/0275589 A1 Aug. 31, 2023

(30) Foreign Application Priority Data

Feb. 28, 2022 (JP) ................................ 2022-029512

(51) Int. Cl.
H03L 7/26 (2006.01)
(52) U.S. Cl.
CPC ...................... H03L 7/26 (2013.01)
(58) Field of Classification Search
CPC ............................................. H03L 7/26
USPC ..................................... 331/94.1
See application file for complete search history.

(56) References Cited

U.S. PATENT DOCUMENTS

| | | | | |
|---|---|---|---|---|
| 6,025,755 A | * | 2/2000 | Camparo | ................ H03L 7/26 331/3 |
| 2008/0317075 A1 | * | 12/2008 | Vanier | ...................... H03L 7/26 372/28 |
| 2023/0387926 A1 | * | 11/2023 | Fujisaku | ................ G04F 5/145 |

FOREIGN PATENT DOCUMENTS

JP 2016-072371 A 5/2016

* cited by examiner

*Primary Examiner* — Joseph Chang
(74) *Attorney, Agent, or Firm* — Sughrue Mion, PLLC (57) ABSTRACT

An atomic oscillator of the present invention includes: a light generator that generates a first excitation light having a designed single wavelength, and also generates a second excitation light containing two frequency components by performing frequency modulation at a designated frequency modulation power; an alkali metal atom gas cell to which the second excitation light containing the two frequency components is emitted while a frequency difference between the two frequency components is changed; a measuring unit that measures a transmitted light amount through the alkali metal atom gas cell; and a calculating unit that calculates the frequency modulation power based on a distribution of the transmitted light amount with respect to the frequency difference between the two frequency components of the second excitation light measured every time the wavelength of the first excitation light and the frequency modulation power are changed by the light generator.

13 Claims, 9 Drawing Sheets

ATOMIC OSCILLATOR

INCORPORATION BY REFERENCE

This application is based upon and claims the benefit of priority from Japanese patent application No. 2022-029512, filed on Feb. 28, 2022, the disclosure of which is incorporated herein in its entirety by reference.

TECHNICAL FIELD

The present invention relates to an atomic oscillator, a control method, a control device, and a program.

BACKGROUND ART

An atomic oscillator is a device that measures accurate time based on the natural frequency of an atom. A compact atomic clock generally measures the natural frequency of an atom using the CPT (Coherent Population Trapping), which is a quantum interference effect occurring when an alkali metal atom gas is irradiated with an excitation light having two frequencies, as the oscillation principle of an atomic oscillator. In the CPT, when the difference between the two frequencies of the excitation light matches the transition frequency between the ground levels of the alkali metal, the excitation light is not absorbed and the amount of transmitted light becomes larger. The atomic clock based on the CPT sweeps the frequencies of the excitation lights, and determines the frequency that maximizes the amount of transmitted light. It is one of the performance indexes of the atomic oscillator whether or not the frequency can be stably acquired for a long term (long-term stability).

In the determination of the frequency using the CPT, a main factor that decreases the abovementioned long-term stability is a temporal change of light shift. A light shift is a phenomenon in which the natural frequency of the atom shifts due to the interaction between the excitation light and the atom. Specifically, the intensity of the total excitation light, a wavelength, and a temporal change in ratio of two frequency components induce a temporal change in light shift, which decreases the long-term stability of the atomic clock.

In a general atomic clock, excitation lights containing multiple frequencies are generated by applying frequency modulation of half the transition frequency between the ground levels of an alkali metal atom to an excitation light of a single frequency. As a result, the $\pm 1^{st}$-order sidebands are generated and used to make CPT. Since the intensity ratio of the $\pm 1^{st}$-order sidebands is about 1:1 at all times, there is an advantage that no correction of the ratio is required in implementation of a stable atomic clock. On the other hand, the method using the $\pm 1^{st}$-order sidebands has a disadvantage that the long-term stability decreases because a change in light shift is relatively great.

As an example to solve this disadvantage, an atomic clock which can suppress a temporal change in light shift by correcting the intensity of the total excitation light has been reported. For example, Patent Document 1 describes an atomic clock including a mechanism correcting the intensity of the total excitation light to a constant value by using two light sources. However, the intensity of the total excitation light cannot be kept constant completely. For this reason, it is not preferable from the viewpoint of the long-term stability to use the $\pm 1^{st}$-order sidebands, as adopted in Patent Document 1, for generation and detection of the CPT because a change in light shift becomes greater with respect to a change in intensity of the total excitation light.

Patent Document 1: Japanese Unexamined Patent Application Publication No. JP-A 2016-072371

The abovementioned problem can be solved by using a pair of $-1^{st}$-order light and $0^{th}$-order light or a pair of $+1^{st}$-order light and $0^{th}$-order light, which are included by applying frequency modulation equal to the transition frequency between the ground levels to a light of single frequency. In a case where frequency modulation equal to the transition frequency between the ground levels is applied to a single-frequency light, the frequencies between the sidebands are separated as compared with a case where frequency modulation of half the transition frequency between the ground levels is applied. In this case, an influence of other than a pair of frequency components most contributing to a CPT resonance is small. As a result, with regard to cesium atoms, in a case where frequency modulation equal to the transition frequency between the ground levels is applied to a single-frequency light, a change in light shift with respect to a change in intensity of the total excitation light becomes about one quarter as compared with a case where frequency modulation of half the transition frequency between the ground levels is applied. Therefore, in development of an atomic clock that is stable with respect to a change in intensity of the total excitation light, it is desirable to use a pair of $-1^{st}$-order light and $0^{th}$-order light or a pair of $+1^{st}$-order light and $0^{th}$-order light included by an excitation light obtained by applying frequency modulation equal to the transition frequency between the ground levels to a single-frequency light. However, since the intensity ratio of $-1^{st}$-order light and $0^{th}$-order light or of $+1^{st}$-order light and $0^{th}$-order light has dependency on a frequency modulation power unlike that of $\pm 1^{st}$-order lights, a mechanism for correcting the intensity ratio is required in implementation of an atomic clock having a high long-term stability.

However, in order to install a mechanism for correcting the intensity ratio, it is required to newly incorporate a device such as a Fabry-Perot interferometer to monitor the intensity ratio, so that a problem arises that downsizing of an atomic oscillator itself cannot be achieved.

SUMMARY OF THE INVENTION

Accordingly, an object of the present invention is to solve the abovementioned problem that it is difficult to provide an atomic oscillator with a high long-term stability while achieving downsizing.

An atomic oscillator as an aspect of the present invention includes: a light generator configured to generate a first excitation light having a designed single wavelength, and also generate a second excitation light containing two frequency components by performing frequency modulation at a designated frequency modulation power; an alkali metal atom gas cell to which the second excitation light containing the two frequency components is emitted while a frequency difference between the two frequency components is changed; a measuring unit configured to measure a transmitted light amount through the alkali metal atom gas cell; and a calculating unit configured to calculate the frequency modulation power based on a distribution of the transmitted light amount with respect to the frequency difference between the two frequency components of the second excitation light measured every time the wavelength of the first excitation light and the frequency modulation power are changed by the light generator.

Further, a control method as an aspect of the present invention is a control method by an atomic oscillator including: a light generator configured to generate a first excitation light having a designed single wavelength, and also generate a second excitation light containing two frequency components by performing frequency modulation at a designated frequency modulation power; an alkali metal atom gas cell to which the second excitation light containing the two frequency components is emitted while a frequency difference between the two frequency components is changed; and a measuring unit configured to measure a transmitted light amount through the alkali metal atom gas cell. The control method includes measuring the transmitted light amount with respect to a change in the frequency difference between the two frequency components of the second excitation light, and calculating the frequency modulation power based on a distribution of the transmitted light amount with respect to the frequency difference between the two frequency components of the second excitation light measured every time the wavelength of the first excitation light and the frequency modulation power are changed by the light generator.

Further, a control device as an aspect of the present invention is a control device that controls an atomic oscillator including: a light generator configured to generate a first excitation light having a designed single wavelength, and also generate a second excitation light containing two frequency components by performing frequency modulation at a designated frequency modulation power; an alkali metal atom gas cell to which the second excitation light containing the two frequency components is emitted while a frequency difference between the two frequency components is changed; and a measuring unit configured to measure a transmitted light amount through the alkali metal atom gas cell. The control device is configured to calculate the frequency modulation power based on a distribution of the transmitted light amount with respect to the frequency difference between the two frequency components of the second excitation light measured every time the wavelength of the first excitation light and the frequency modulation power are changed by the light generator.

Further, a computer program as an aspect of the present invention includes instructions for causing a control device to execute a process. The control device controls an atomic oscillator including: a light generator configured to generate a first excitation light having a designed single wavelength and also generate a second excitation light containing two frequency components by performing frequency modulation at a designated frequency modulation power; an alkali metal atom gas cell to which the second excitation light containing the two frequency components is emitted while a frequency difference between the two frequency components is changed; and a measuring unit configured to measure a transmitted light amount through the alkali metal atom gas cell. The process is to calculate the frequency modulation power based on the distribution of the transmitted light amount with respect to the frequency difference between the two frequency components of the second excitation light measured every time the wavelength of the first excitation light and the frequency modulation power are changed by the light generator.

With the configurations as described above, the present invention can provide an atomic oscillator with a high long-term stability while achieving downsizing.

EXAMPLE EMBODIMENT

First Example Embodiment

A first example embodiment of the present invention will be described with reference to FIGS. 1 to 7.

Configuration and Operation

Figure 1:
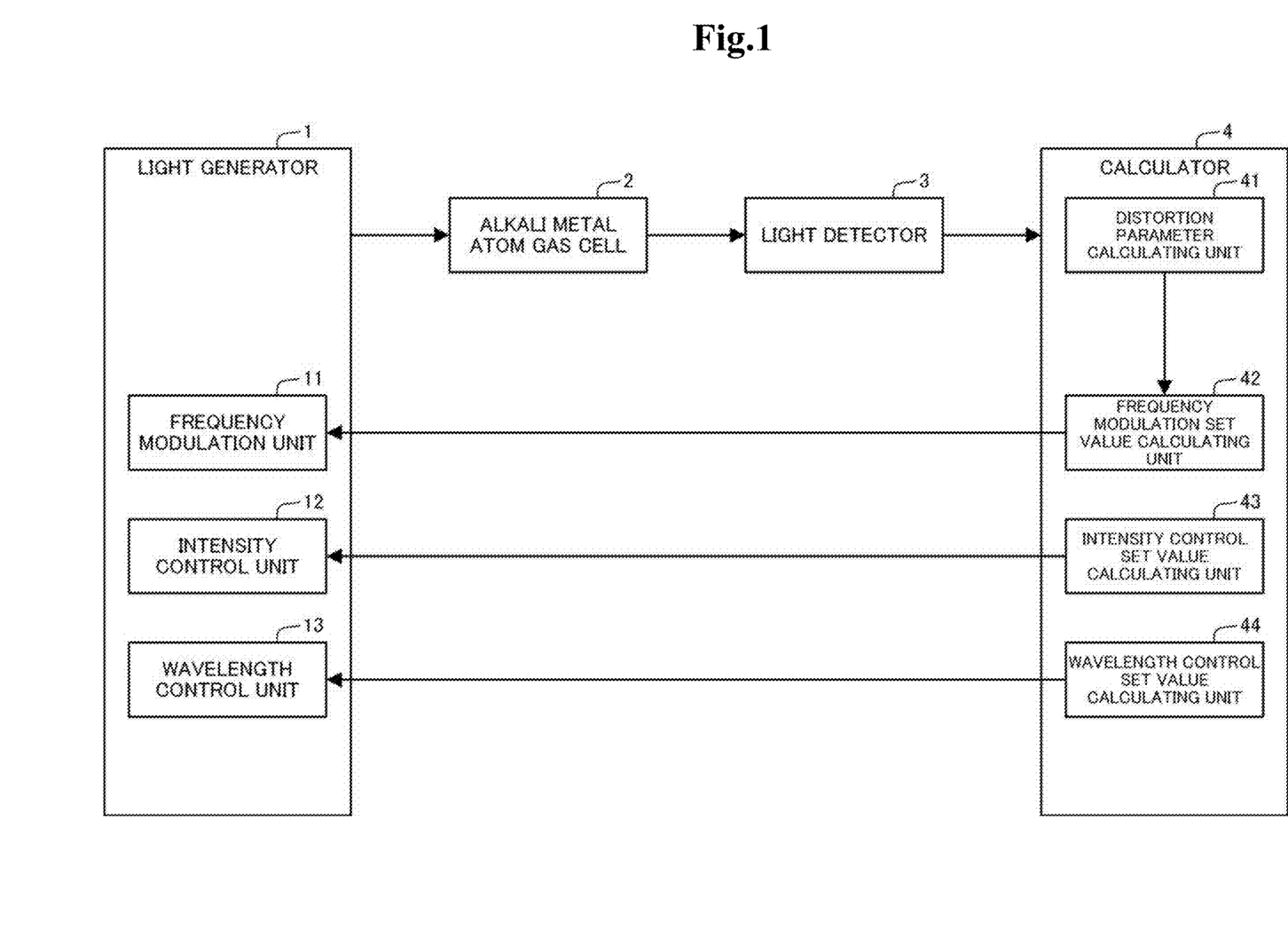
FIG. 1 is a block diagram showing an outline of a configuration of an atomic oscillator in a first example embodiment of the present invention.

FIG. 1 is a block diagram showing an outline of a configuration of an atomic oscillator according to this example embodiment. The atomic oscillator in this example embodiment includes a light generator 1, an alkali metal atom gas cell 2, a light detector 3, and a calculator 4. The light generator 1 includes a frequency modulation unit 11, an intensity control unit 12, and a wavelength control unit 13. Moreover, the calculator 4 includes a distortion parameter calculating unit 41, a frequency modulation set value calculating unit 42, an intensity control set value calculating unit 43, and a wavelength control set value calculating unit 44. The calculator 4 is composed of an information processing device (control device) including an arithmetic logic unit and a memory unit, and the respective units 41 to 44 of the calculator 4 are implemented by execution of a program by the arithmetic logic unit.

The light generator 1 generates an excitation light of single wavelength, and generates an excitation light having two frequency components by performing frequency modulation to the excitation light of single wavelength to irradiate the alkali metal atom gas cell 2 with the excitation light. Specifically, the light generator 1 generates an excitation light of single wavelength in the range of 894.5770 to 894.5820 nm by the wavelength control unit 13 based on a set value designated by the wavelength control set value calculating unit 44 of the calculator 4. This single-wavelength excitation light (first excitation light) is sent to the frequency modulation unit 11 and frequency-modulated with a modulation frequency near 9.2 GHz corresponding to the transition frequency between the ground levels of cesium atoms and a frequency modulation power of 5 to 18 dBm that are designated by the frequency modulation set value calculating unit 42 of the calculator 4, and is thereby modulated to an excitation light (second excitation light) containing $0^{th}$-order and $-1^{st}$-order sidebands. Next, this excitation light is sent to the intensity control unit 12 and attenuated to 1 to 0.1 times the intensity set by the intensity control set value calculating unit 43 of the calculator 4. This excitation light is converted into circularly polarized light by a λ/2 plate and the a λ/4 plate, and is thereafter emitted to the cesium atom gas cell 2.

Thus, since the wavelength of the single-wavelength excitation light, the modulation frequency and frequency modulation power at the time of frequency modulation, and the intensity of the total excitation light are set by the calculator 4 as needed, the light generator 1 irradiates the alkali metal atom gas cell 2 with the generated excitation light while changing, that is, sweeping the set values.

The alkali metal atom gas cell 2 contains alkali metal atoms such as cesium atoms, rubidium atoms, sodium atoms, and potassium atoms. In the first example embodiment, the gas cell contains cesium atoms. The alkali metal atom gas cell 2 is installed in a magnetic field application space, and the excitation light from the light generator 1 enters and part of the light passes through the alkali metal atom gas cell 1 as described before.

The light detector 3 (measuring unit) detects a transmitted light having passed through the alkali metal atom gas cell 2, and measures the amount of the transmitted light. At the time, since the single-wavelength excitation light is emitted while the set values of the wavelength of the excitation light, the modulation frequency and frequency modulation power at the time of frequency modulation, and the intensity of the total excitation light are changed, the measured transmitted light amount is passed to the calculator 4 in association with the respective set values having been changed.

Figure 2:
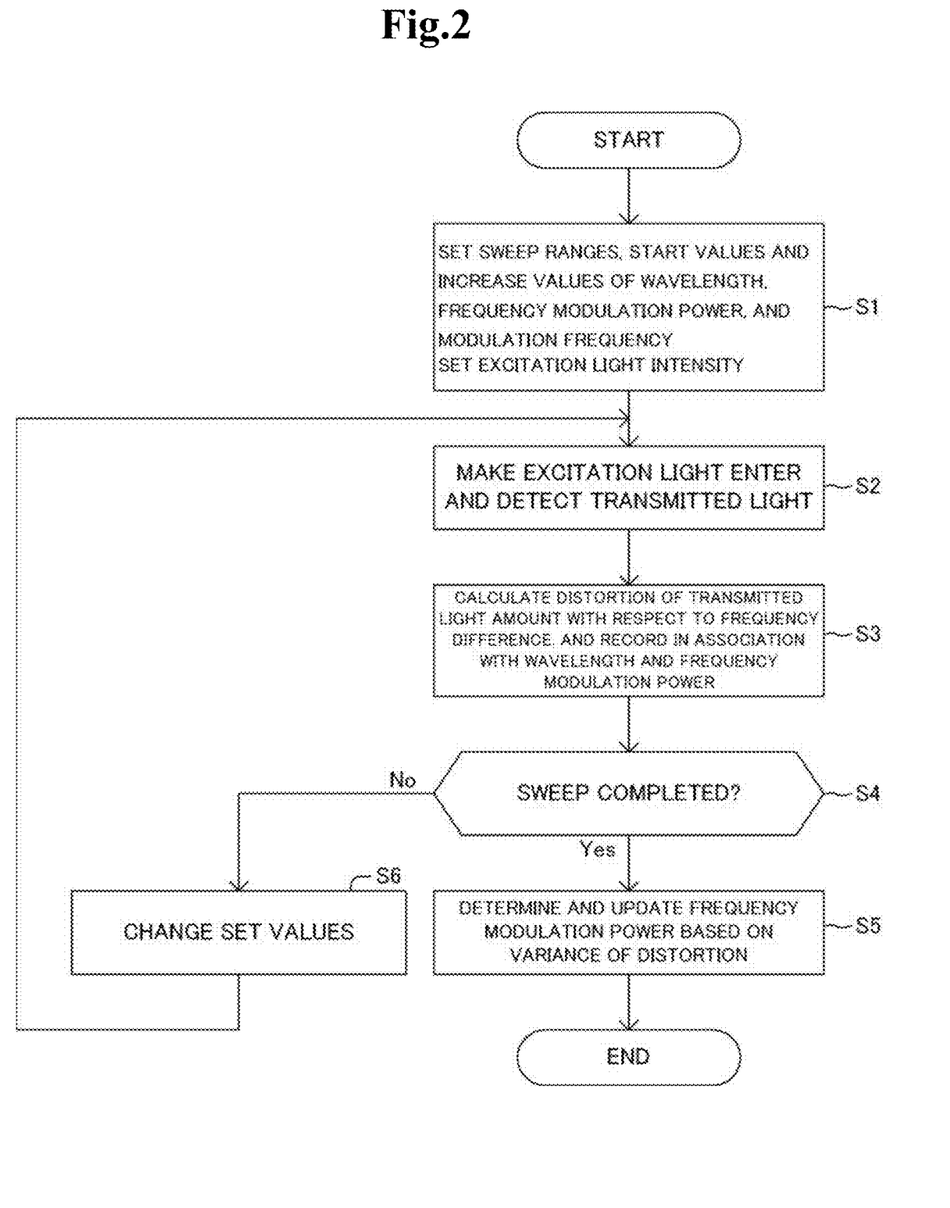
FIG. 2 is a flowchart showing an algorithm for calculating a frequency modulation power by the atomic oscillator disclosed in FIG. 1.

The calculator 4 (calculating unit) determines a set value for correcting the frequency modulation power by the respective units 41 to 44 shown in FIG. 1 in accordance with an algorithm shown in FIG. 2. First, the wavelength control set value calculating unit 44, the frequency modulation set value calculating unit 42 and the intensity control set value calculating unit 43 of the calculator 4 respectively set start values, increase values and sweep ranges of the set values of the wavelength of the single-wavelength excitation light, the modulation frequency and frequency modulation power at the time of frequency modulation and the intensity of the excitation light, and the calculator 4 sets an excitation light intensity and controls the light generator 1 to generate an excitation light at the set values (step S1). Consequently, the excitation light is emitted from the light generator 1 to the alkali metal atom gas cell 2, and the transmitted light is measured by the light detector 3 (step S2).

Figure 4:
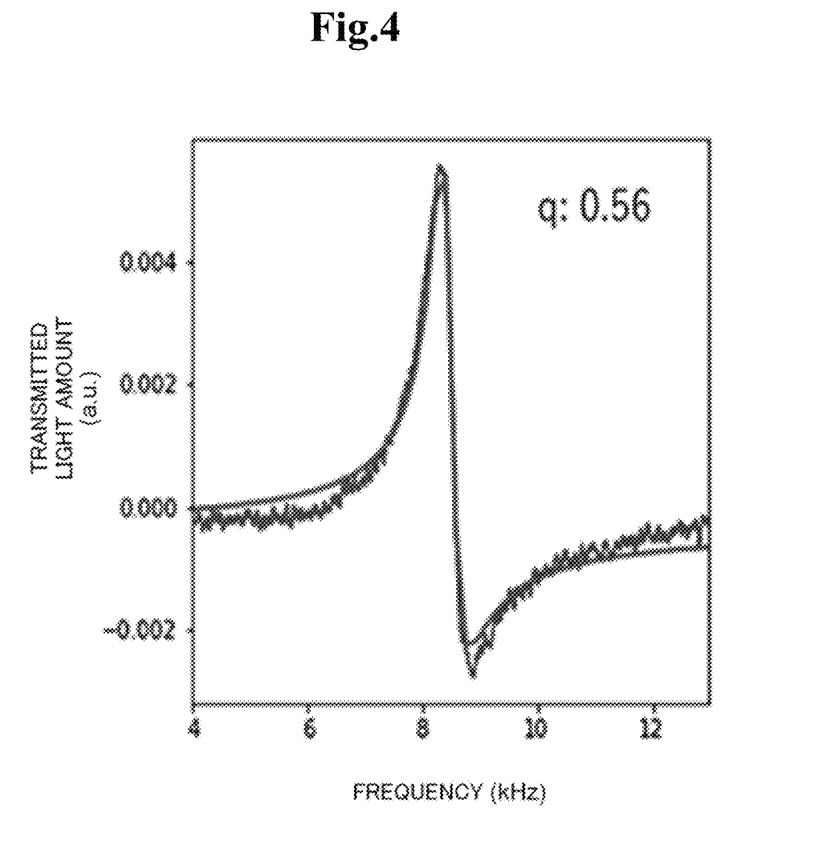
FIG. 4 is a figure showing data processing on a measured value by the atomic oscillator disclosed in FIG. 3.

The distortion parameter calculating unit 41 plots a transmitted light amount with respect to a swept frequency difference between $0^{th}$-order and $-1^{st}$-order sidebands from the transmitted light amount measured by the light detector 3. That is to say, the distortion parameter calculating unit 41 generates a distribution of the transmitted light amount with respect to the difference between the two frequencies of the excitation light. Then, the distortion parameter calculating unit 41 calculates a distortion parameter q (distribution characteristic value) representing the characteristic of the distribution by fitting the plot using the method of least squares in Equation 1. Then, the distortion parameter calculating unit 41 records the distortion parameter q together with the set values of the single-wavelength excitation light and the frequency modulation power at the time (step S3).

$$y = a\frac{\{b(x-x_0)+q\}^2}{\{b(x-x_0)\}^2 + 1} + c \quad \text{[Equation 1]}$$

y: transmitted light amount
x: frequency
$x_0$: resonance frequency
q: distortion parameter
a: coefficient
$b^{-1}$: half width
c: constant term It is known that a transmission light amount distribution in a general CPT resonance can be fitted by Equation 1. The distortion parameter q represents the ratio of an asymmetrical component and a symmetrical component in the transmission light amount distribution. Specifically, when a coefficient of a symmetrical Lorentz component is S and a coefficient of an antisymmetric Lorentz component is A, q is described as A/S. Therefore, the smaller the value (degree) of the distortion parameter q is, the smaller the proportion of the asymmetrical component to the symmetrical component is, resulting in a characteristic such that the transmission light distribution is symmetrical. An example of the fitting of the transmission amount distribution and the distortion parameter q is shown in FIG. 4, which will be described later.

Subsequently, in accordance with the algorithm shown in FIG. 2, the calculator 4 repeats the abovementioned measurement while sweeping the set value of the wavelength of the single-wavelength excitation light in the range of 894.5770 to 894.5820 nm and sweeping the set value of the frequency modulation power in the range of 5 to 18 dBm. (No at step S4, step S6). Consequently, the calculator 4 generates a data set including the wavelength of the single-wavelength excitation light, the frequency modulation power, and the distortion parameter q. Then, for the data set, the calculator 4 calculates, for example, the variance of q with respect to the value of the frequency modulation power, and determines the value of the frequency modulation power that minimizes the variance of q. Then, the frequency modulation set value calculating unit 42 of the calculator 4 updates the value of the frequency modulation power in the frequency modulation unit 11 of the light generator 1 to the determined value as a new set value (step S5).

As described above, the atomic oscillator according to the first example embodiment of the present invention includes a mechanism that fixes the set value of the frequency modulation power of the frequency modulation unit 11 to a constant value based on the distribution of the transmission light amount measured by the light detector 3. Consequently, there is no need to newly introduce a device that directly monitors the intensity ratio, and an atomic oscillator can be provided that is compact and has a high long-term stability because a temporal change in light shift is small.

Verification Experiment

Next, the result of a verification experiment performed using an atomic oscillator shown in FIG. 3, which is an embodied configuration of the atomic oscillator shown in FIG. 1, will be described. In the atomic oscillator shown in FIG. 3, first, a laser 13 that can control the wavelength generates an excitation light. Next, a signal generator and a light frequency modulator 11 perform frequency modulation on the excitation light, and a light attenuator 12 controls the intensity of the frequency-modulated excitation light. Then, the excitation light modulated to the intensity set by the light attenuator 12 is converted into circularly polarized light by a λ/2 plate and a λ/4 plate.

Next, a cesium atom gas cell 2 placed at a position through which the frequency-modulated and intensity-modulated excitation light passes is irradiated with the excitation light from the light generator 1. The cesium atom gas cell is installed in a magnetic field application space. A light detector 3 is placed at a position to detect light transmitted by the cesium atom gas cell, and a computer 4 receives a transmitted light amount recorded by the light detector 3. Then, the computer 4 calculates the distortion parameter q using the measured transmitted light amount, and determines a new frequency modulation power.

Figure 3:
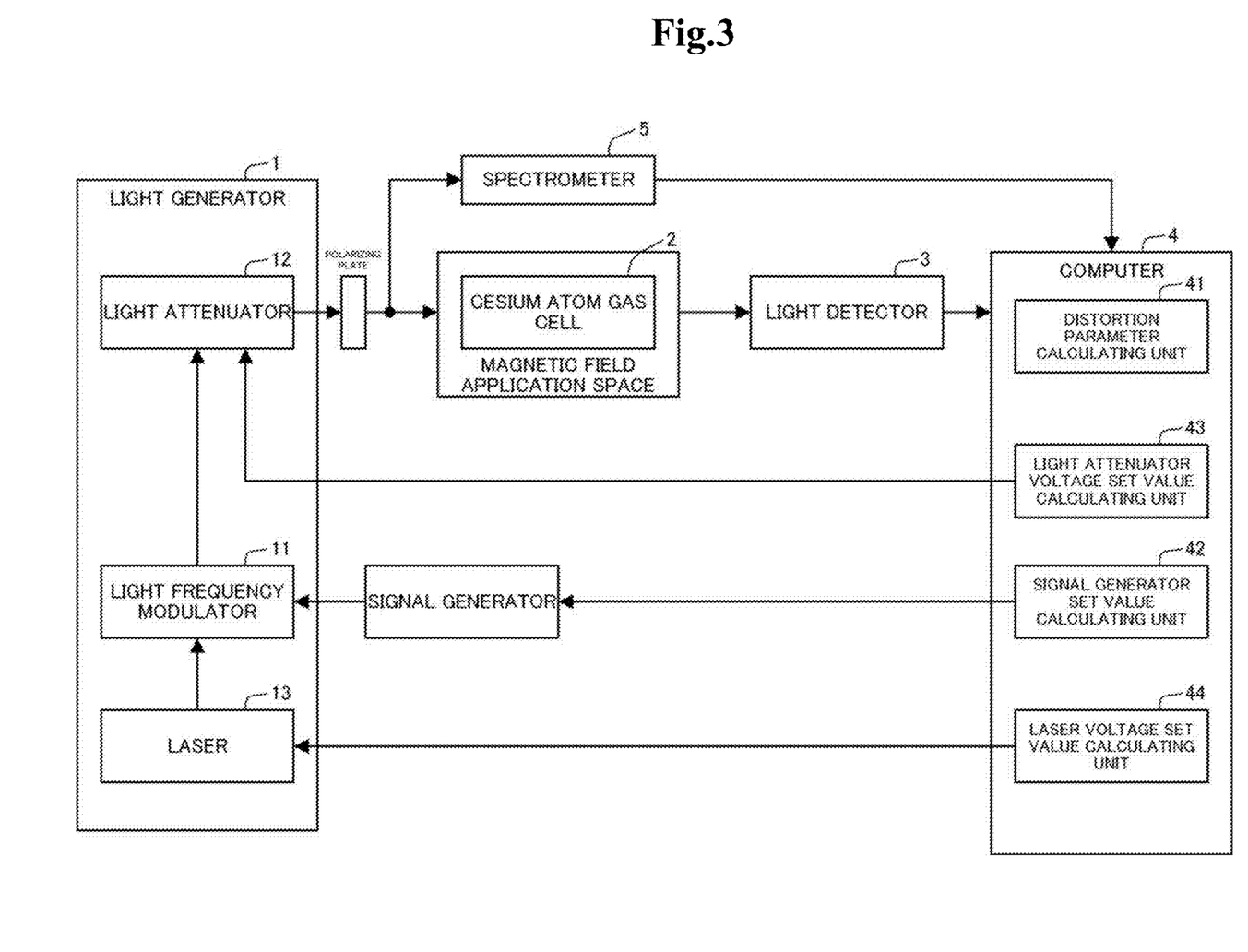
FIG. 3 is a block diagram showing a configuration of the atomic oscillator used in a verification experiment in the first example embodiment of the present invention.

FIG. 4 shows a result that a distortion parameter calculating unit 41 of the computer 4 of the atomic oscillator shown in FIG. 3 plots a transmitted light amount with respect to the frequency difference between the $0^{th}$-order and $-1^{st}$-order sidebands and performs fitting by Equation 1 shown above. As shown in FIG. 4, it can be confirmed that a transmitted light amount distribution is well fitted by Equation 1. Thus, it was shown that a specific $0^{th}$-order wavelength, a resonance frequency with respect to the frequency modulation power and the excitation light intensity, and the distortion parameter q can be calculated by the abovementioned method.

Figure 5:
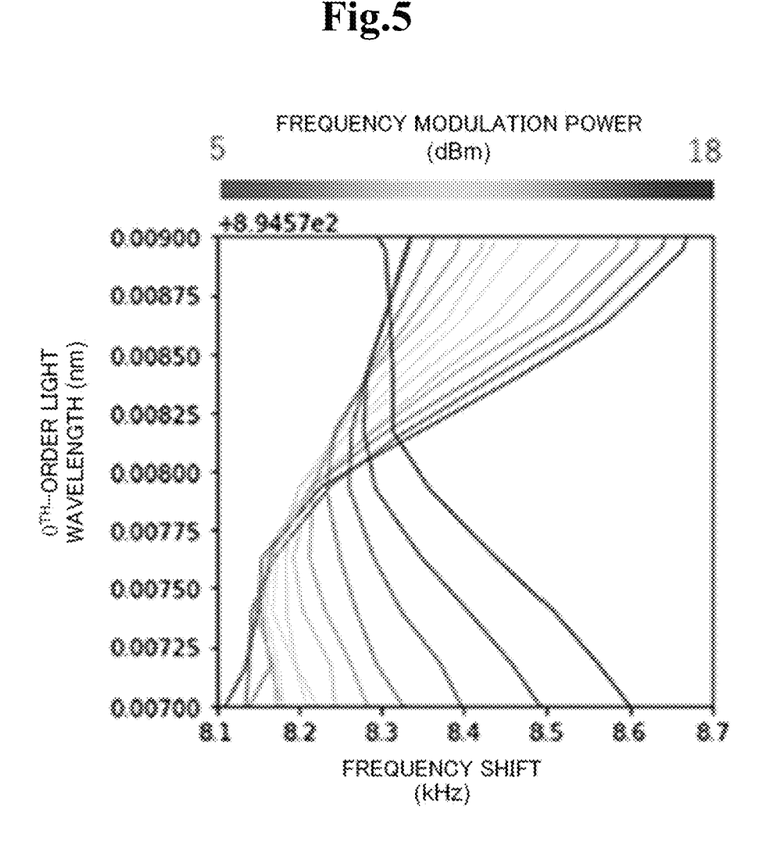
FIG. 5 is a figure showing data processing on a measured value by the atomic oscillator disclosed in FIG. 3.

FIG. 5 shows the result of examining a light shift at the time of sweeping the $0^{th}$-order light wavelength and the frequency modulation power. As a result of this experiment, it was confirmed that the resonance frequency shifted depending on the frequency modulation power. Therefore, it was shown that a change in shift can be suppressed and a long-term stability can be increased by providing a mechanism that fixes the frequency modulation power to a constant value.

Figure 6:
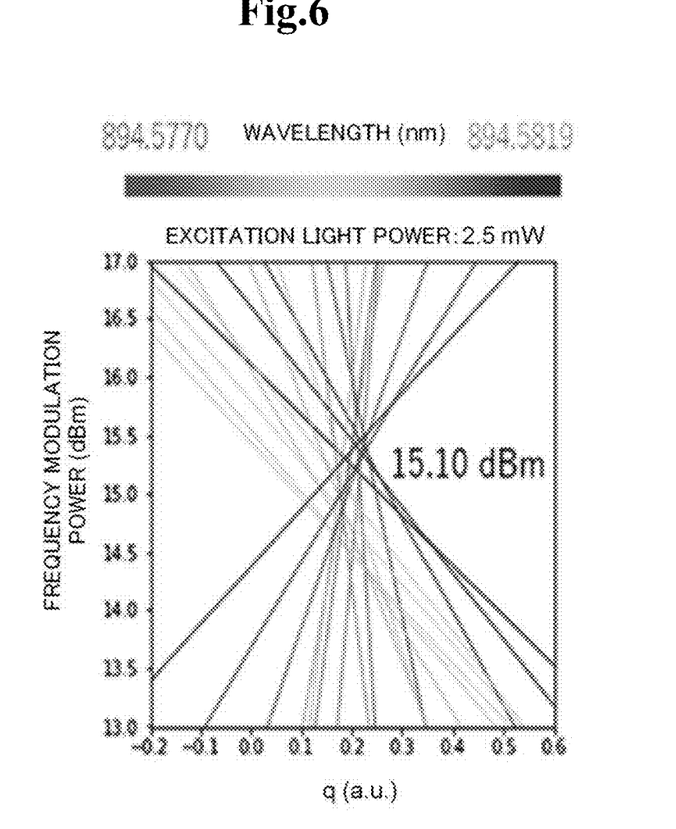
FIG. 6 is a figure showing data processing on a measured value by the atomic oscillator disclosed in FIG. 3.

FIG. 6 shows the result of linearly fitting the plots of the distortion parameter q and the frequency modulation power for each wavelength. The frequency modulation power that minimizes the variance of q with respect to a change in wavelength was calculated to be 15.10 dBm.

Figure 7:
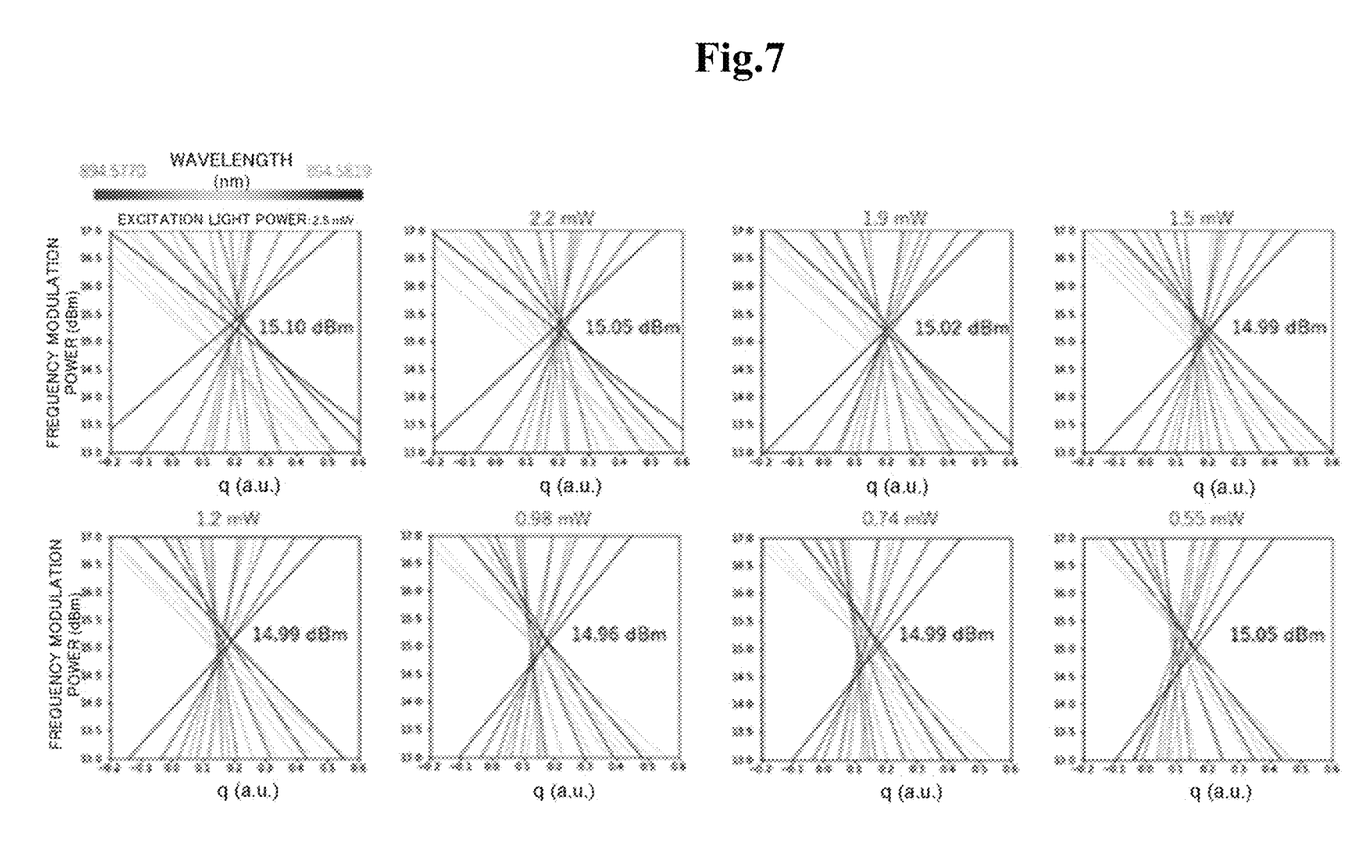
FIG. 7 is a figure showing data processing on a measured value by the atomic oscillator disclosed in FIG. 3.

FIG. 7 shows the result of performing the same experiment as in FIG. 6 while changing the intensity of the total excitation light. The figure shows a frequency modulation power that minimizes the variance of the distortion parameter q with respect to the frequency modulation power calculated for each wavelength of the single-wavelength excitation light. As a result of the experiment, a strong frequency modulation power that minimizes the variance is 15.01±0.05 (standard deviation) dBm, independent of the intensity of the total excitation light. From this result, by providing a feedback mechanism that searches for and fixes a frequency modulation power that minimizes the variance of the distortion parameter q at the beginning of the use of the atomic oscillator, it is possible to provide an atomic oscillator in which the intensity of the total excitation light is kept constant, a temporal change in light shift is small, and a long-term stability is high.

As described above, the atomic oscillator according to the present invention can be utilized in the following fields. First, GPS (Global Positioning System) performs stable and highly precise positioning based on time data of an atomic clock mounted on a satellite. If an inexpensive and highly precise compact atomic clock is put into practical use, it can be used in various devices such as an automobile, a smartphone, a compact satellite, and a base station for mobile phones. Moreover, by mounting a highly precise compact atomic clock on a sensor used in a place where GPS cannot reach, such as inside a building, on the sea floor, and in a tunnel, it can be considered that it is possible to enable high-precision measurement and efficient remote operation of a sensor through time synchronization between a plurality of sensors. In addition, by mounting a high-precision compact atomic clock on a mobile object such as an automobile and an aircraft, it is expected that stable and high-precision positioning, as well as the realization of autonomous driving technology will be achieved.

Second Example Embodiment

Figure 8:
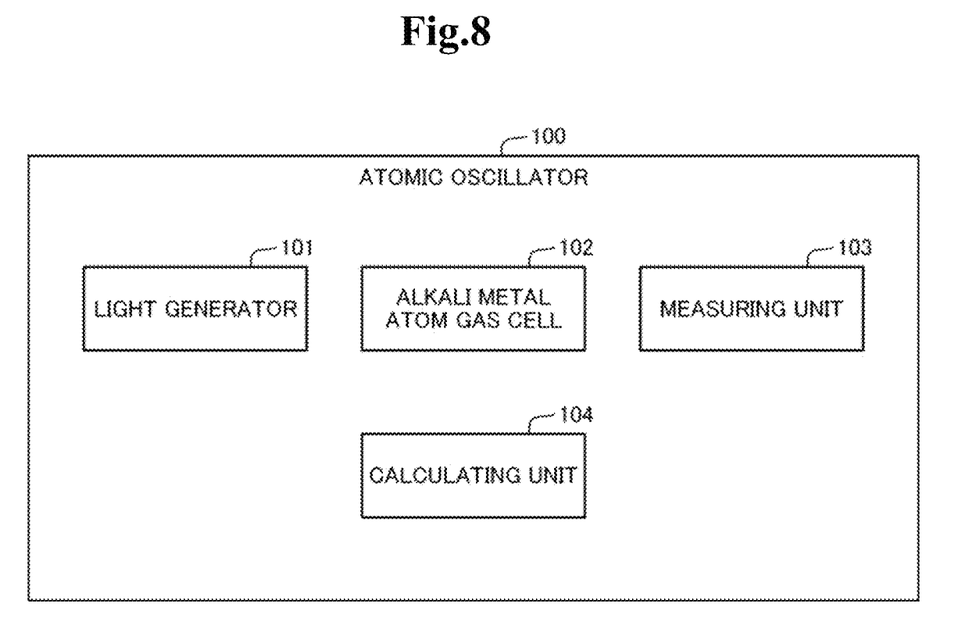
FIG. 8 is a block diagram showing a configuration of an atomic oscillator in a second example embodiment of the present invention.
Figure 9:
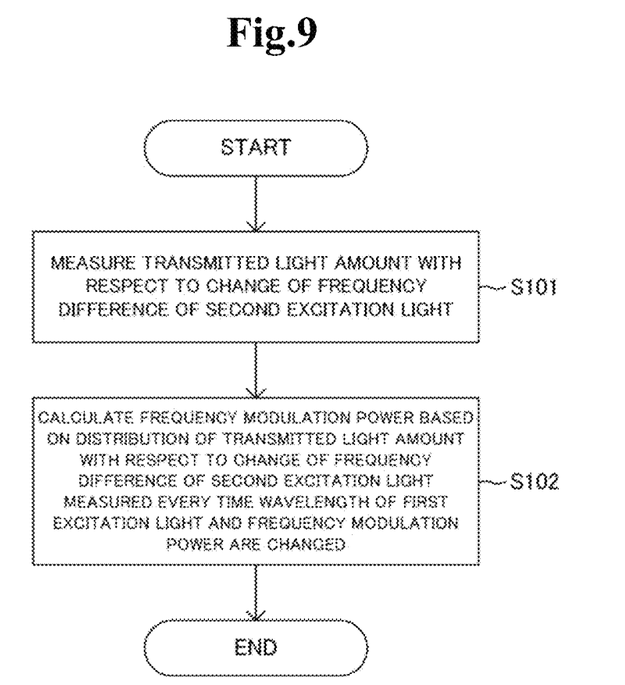
FIG. 9 is a flowchart showing an operation of the atomic oscillator in the second example embodiment of the present invention.

Next, a second example embodiment of the present invention will be described with reference to FIGS. 8 to 9. FIG. 8 is a block diagram showing a configuration of an atomic oscillator in the second example embodiment, and FIG. 9 is a flowchart showing an operation of the atomic oscillator. In this example embodiment, an overview of the configuration of the atomic oscillator and the control method described in the above example embodiment is shown.

As shown in FIG. 8, an atomic oscillator 100 in this example embodiment includes: a light generator 101 that generates a first excitation light having a designed single wavelength, and also generates a second excitation light containing two frequency components by performing frequency modulation at a designated frequency modulation power; an alkali metal atom gas cell 102 to which the second excitation light containing the two frequency components is emitted while a frequency difference between the two frequency components is changed; a measuring unit 103 that measures a transmitted light amount through the alkali metal atom gas cell; and a calculating unit 104 that calculates the frequency modulation power based on a distribution of the transmitted light amount with respect to the frequency difference between the two frequency components of the second excitation light measured every time the wavelength of the first excitation light and the frequency modulation power are changed by the light generator.

Then, as shown in FIG. 9, the calculating unit 104 (control device) configured as described above executes a process to measure the amount of the transmitted light with respect to the frequency difference between the two frequency components in the second excitation light (step S101) and calculate the frequency modulation power based on the distribution of the amount of the transmitted light with respect to the frequency difference between the two frequency components in the second excitation light measured every time the wavelength of the first excitation light and the frequency modulation power are changed by the light generator (step S102). The process executed by the calculating unit 104 is implemented by execution of a program by an arithmetic logic unit configuring the calculating unit 104.

As described above, according to the present invention, the frequency modulation power is calculated based on the distribution of the amount of the transmitted light with respect to the frequency difference between the two frequency components in the second excitation light measured every time the wavelength of the first excitation light and the frequency modulation power are changed. Then, by setting and fixing the frequency modulation power, it is possible to suppress a temporal change in light shift, and provide an atomic oscillator that has a high long-term stability while achieving downsizing.

Although the present invention has been described above with reference to the example embodiments, the present invention is not limited to the above example embodiments. The configurations and details of the present invention can be changed in various manners that can be understood by one skilled in the art within the scope of the present invention.

Supplementary Notes

The whole or part of the example embodiments disclosed above can be described as the following supplementary notes. Below, an overview of configurations of an atomic oscillator, a control method, a control device and a program according to the present invention will be described. However, the present invention is not limited to the following configurations.

(Supplementary Note 1)

An atomic oscillator comprising:
a light generator configured to generate a first excitation light having a designed single wavelength, and also generate a second excitation light containing two frequency components by performing frequency modulation at a designated frequency modulation power;
an alkali metal atom gas cell to which the second excitation light containing the two frequency components is emitted while a frequency difference between the two frequency components is changed;
a measuring unit configured to measure a transmitted light amount through the alkali metal atom gas cell; and
a calculating unit configured to calculate the frequency modulation power based on a distribution of the transmitted light amount with respect to the frequency difference between the two frequency components of the second excitation light measured every time the wavelength of the first excitation light and the frequency modulation power are changed by the light generator.

(Supplementary Note 2)

The atomic oscillator according to Supplementary Note 1, wherein
the calculating unit is configured to change and designate the wavelength of the first excitation light and the frequency modulation power for the light generator, and also calculate the frequency modulation power based on the distribution of the transmitted light amount with respect to the frequency difference between the two frequency components of the second excitation light measured every time the wavelength of the first excitation light and the frequency modulation power are changed.

(Supplementary Note 3)

The atomic oscillator according to Supplementary Note 2, wherein
the calculating unit is configured to calculate a distribution characteristic value representing a degree to which the distribution of the transmitted light amount with respect to the frequency difference between the two frequency components of the second excitation light has a preset characteristic, and calculate the frequency modulation power based on the distribution characteristic value.

(Supplementary Note 4)

The atomic oscillator according to Supplementary Note 3, wherein
the calculating unit is configured to calculate the distribution characteristic value representing a degree to which the distribution of the transmitted light amount with respect to the frequency difference between the two frequency components of the second excitation light becomes symmetrical about a resonance frequency, and calculate the frequency modulation power based on the distribution characteristic value.

(Supplementary Note 5)

The atomic oscillator according to Supplementary Note 3 or 4, wherein
the calculating unit is configured to specify the frequency modulation power based on the distribution characteristic value with respect to the frequency modulation power for each changed wavelength of the first excitation light, and designate the specified frequency modulation power for the light generator.

(Supplementary Note 6)

The atomic oscillator according to Supplementary Note 5, wherein
the calculating unit is configured to specify the frequency modulation power that minimizes a variance of the distribution characteristic value based on the distribution characteristic value with respect to the frequency modulation power for each changed wavelength of the first excitation light, and designate the specified frequency modulation power for the light generator.

(Supplementary Note 7)

A control method by an atomic oscillator including: a light generator configured to generate a first excitation light having a designed single wavelength, and also generate a second excitation light containing two frequency components by performing frequency modulation at a designated frequency modulation power; an alkali metal atom gas cell to which the second excitation light containing the two frequency components is emitted while a frequency difference between the two frequency components is changed; and a measuring unit configured to measure a transmitted light amount through the alkali metal atom gas cell, the control method comprising
measuring the transmitted light amount with respect to a change in the frequency difference between the two frequency components of the second excitation light, and calculating the frequency modulation power based on a distribution of the transmitted light amount with respect to the frequency difference between the two frequency components of the second excitation light measured every time the wavelength of the first excitation light and the frequency modulation power are changed by the light generator.

(Supplementary Note 7.1)

The control method according to Supplementary Note 7, comprising
changing and designating the wavelength of the first excitation light and the frequency modulation power for the light generator, and also calculating the frequency modulation power based on the distribution of the transmitted light amount with respect to the frequency difference between the two frequency components of the second excitation light measured every time the wavelength of the first excitation light and the frequency modulation power are changed.

(Supplementary Note 7.2)

The control method according to Supplementary Note 7.1, comprising
calculating a distribution characteristic value representing a degree to which the distribution of the transmitted light amount with respect to the frequency difference between the two frequency components of the second excitation light has a preset characteristic, and calculating the frequency modulation power based on the distribution characteristic value.

(Supplementary Note 7.3)

The control method according to Supplementary Note 7.2, comprising
calculating the distribution characteristic value representing a degree to which the distribution of the transmitted light amount with respect to the frequency difference between the two frequency components of the second excitation light becomes symmetrical about a resonance frequency, and calculating the frequency modulation power based on the distribution characteristic value.

(Supplementary Note 7.4)

The control method according to Supplementary Note 7.2 or 7.3, comprising specifying the frequency modulation power based on the distribution characteristic value with respect to the frequency modulation power for each changed wavelength of the first excitation light, and designating the specified frequency modulation power for the light generator.

(Supplementary Note 7.5)

The control method according to Supplementary Note 7.4, comprising specifying the frequency modulation power that minimizes a variance of the distribution characteristic value based on the distribution characteristic value with respect to the frequency modulation power for each changed wavelength of the first excitation light, and designating the specified frequency modulation power for the light generator.

(Supplementary Note 8)

A control device that controls an atomic oscillator including: a light generator configured to generate a first excitation light having a designed single wavelength, and also generate a second excitation light containing two frequency components by performing frequency modulation at a designated frequency modulation power; an alkali metal atom gas cell to which the second excitation light containing the two frequency components is emitted while a frequency difference between the two frequency components is changed; and a measuring unit configured to measure a transmitted light amount through the alkali metal atom gas cell, the control device being configured to calculate the frequency modulation power based on a distribution of the transmitted light amount with respect to the frequency difference between the two frequency components of the second excitation light measured every time the wavelength of the first excitation light and the frequency modulation power are changed by the light generator.

(Supplementary Note 9)

A computer program comprising instructions for causing a control device to execute a process, the control device controlling an atomic oscillator including a light generator configured to generate a first excitation light having a designed single wavelength and also generate a second excitation light containing two frequency components by performing frequency modulation at a designated frequency modulation power, an alkali metal atom gas cell to which the second excitation light containing the two frequency components is emitted while a frequency difference between the two frequency components is changed and a measuring unit configured to measure a transmitted light amount through the alkali metal atom gas cell, the process being to calculate the frequency modulation power based on the distribution of the transmitted light amount with respect to the frequency difference between the two frequency components of the second excitation light measured every time the wavelength of the first excitation light and the frequency modulation power are changed by the light generator.

DESCRIPTION OF NUMERALS 1 light generator
2 alkali metal atom gas cell
3 light detector
4 calculator
11 frequency modulation unit, light frequency modulator
12 intensity control unit, light attenuator
13 wavelength control unit, laser
41 distortion parameter calculating unit
42 frequency modulation set value calculating unit, signal generator set value calculating unit
43 intensity control set value calculating unit, light attenuator voltage set value calculating unit
44 wavelength control unit set value calculating unit, laser voltage set value calculating unit
100 atomic oscillator
101 light generator
102 alkali metal atom gas cell
103 measuring unit
104 calculating unit

The invention claimed is:

1. An atomic oscillator comprising:
a light generator configured to generate a first excitation light having a designed single wavelength, and also generate a second excitation light containing two frequency components by performing frequency modulation at a designated frequency modulation power;
an alkali metal atom gas cell to which the second excitation light containing the two frequency components is emitted while a frequency difference between the two frequency components is changed;
a measuring unit configured to measure a transmitted light amount through the alkali metal atom gas cell; and
a calculating unit configured to calculate the frequency modulation power based on a distribution of the transmitted light amount with respect to the frequency difference between the two frequency components of the second excitation light measured every time the wavelength of the first excitation light and the frequency modulation power are changed by the light generator.

2. The atomic oscillator according to claim 1, wherein the calculating unit is configured to change and designate the wavelength of the first excitation light and the frequency modulation power for the light generator, and also calculate the frequency modulation power based on the distribution of the transmitted light amount with respect to the frequency difference between the two frequency components of the second excitation light measured every time the wavelength of the first excitation light and the frequency modulation power are changed.

3. The atomic oscillator according to claim 2, wherein the calculating unit is configured to calculate a distribution characteristic value representing a degree to which the distribution of the transmitted light amount with respect to the frequency difference between the two frequency components of the second excitation light has a preset characteristic, and calculate the frequency modulation power based on the distribution characteristic value.

4. The atomic oscillator according to claim 3, wherein the calculating unit is configured to calculate the distribution characteristic value representing a degree to which the distribution of the transmitted light amount with respect to the frequency difference between the two frequency components of the second excitation light becomes symmetrical about a resonance frequency, and calculate the frequency modulation power based on the distribution characteristic value.

5. The atomic oscillator according to claim 3, wherein
the calculating unit is configured to specify the frequency modulation power based on the distribution characteristic value with respect to the frequency modulation power for each changed wavelength of the first excitation light, and designate the specified frequency modulation power for the light generator.

6. The atomic oscillator according to claim 5, wherein
the calculating unit is configured to specify the frequency modulation power that minimizes a variance of the distribution characteristic value based on the distribution characteristic value with respect to the frequency modulation power for each changed wavelength of the first excitation light, and designate the specified frequency modulation power for the light generator.

7. A control method by an atomic oscillator including: a light generator configured to generate a first excitation light having a designed single wavelength, and also generate a second excitation light containing two frequency components by performing frequency modulation at a designated frequency modulation power; an alkali metal atom gas cell to which the second excitation light containing the two frequency components is emitted while a frequency difference between the two frequency components is changed; and a measuring unit configured to measure a transmitted light amount through the alkali metal atom gas cell, the control method comprising
measuring the transmitted light amount with respect to a change in the frequency difference between the two frequency components of the second excitation light, and calculating the frequency modulation power based on a distribution of the transmitted light amount with respect to the frequency difference between the two frequency components of the second excitation light measured every time the wavelength of the first excitation light and the frequency modulation power are changed by the light generator.

8. The control method according to claim 7, comprising
changing and designating the wavelength of the first excitation light and the frequency modulation power for the light generator, and also calculating the frequency modulation power based on the distribution of the transmitted light amount with respect to the frequency difference between the two frequency components of the second excitation light measured every time the wavelength of the first excitation light and the frequency modulation power are changed.

9. The control method according to claim 8, comprising
calculating a distribution characteristic value representing a degree to which the distribution of the transmitted light amount with respect to the frequency difference between the two frequency components of the second excitation light has a preset characteristic, and calculating the frequency modulation power based on the distribution characteristic value.

10. The control method according to claim 9, comprising
calculating the distribution characteristic value representing a degree to which the distribution of the transmitted light amount with respect to the frequency difference between the two frequency components of the second excitation light becomes symmetrical about a resonance frequency, and calculating the frequency modulation power based on the distribution characteristic value.

11. The control method according to claim 9, comprising
specifying the frequency modulation power based on the distribution characteristic value with respect to the frequency modulation power for each changed wavelength of the first excitation light, and designating the specified frequency modulation power for the light generator.

12. The control method according to claim 11, comprising
specifying the frequency modulation power that minimizes a variance of the distribution characteristic value based on the distribution characteristic value with respect to the frequency modulation power for each changed wavelength of the first excitation light, and designating the specified frequency modulation power for the light generator.

13. A non-transitory computer-readable storage medium having a computer program stored therein, the computer program comprising instructions for causing a control device to execute a process, the control device controlling an atomic oscillator including a light generator configured to generate a first excitation light having a designed single wavelength and also generate a second excitation light containing two frequency components by performing frequency modulation at a designated frequency modulation power, an alkali metal atom gas cell to which the second excitation light containing the two frequency components is emitted while a frequency difference between the two frequency components is changed, and a measuring unit configured to measure a transmitted light amount through the alkali metal atom gas cell, the process being to
calculate the frequency modulation power based on the distribution of the transmitted light amount with respect to the frequency difference between the two frequency components of the second excitation light measured every time the wavelength of the first excitation light and the frequency modulation power are changed by the light generator.

* * * * *